United States Patent [19]

Lenz

[11] Patent Number: 4,496,911
[45] Date of Patent: Jan. 29, 1985

[54] INTEGRATED AMPLIFIER CIRCUIT

[75] Inventor: Michael Lenz, Munich, Fed. Rep. of Germany

[73] Assignee: Siemens AG, Berlin and Munich, Fed. Rep. of Germany

[21] Appl. No.: 534,663

[22] Filed: Sep. 22, 1983

[30] Foreign Application Priority Data

Sep. 23, 1982 [DE] Fed. Rep. of Germany ....... 3235289

[51] Int. Cl.³ .............................................. H03F 1/34
[52] U.S. Cl. .................................... 330/297; 330/307; 330/293
[58] Field of Search ............... 330/202, 203, 293, 291, 330/297, 307

[56] References Cited

U.S. PATENT DOCUMENTS 3,453,554 7/1969 Shoemaker ..................... 330/297 X Primary Examiner—James B. Mullins
Assistant Examiner—Steven J. Mottola
Attorney, Agent, or Firm—Herbert L. Lerner; Laurence A. Greenberg

[57] ABSTRACT

An integrated amplifier circuit includes an operational amplifier, a signal input terminal connected to the non-inverting signal input of the operational amplifier, a signal output terminal connected to the signal output of the operational amplifier, a first supply terminal at supply potential, a second supply terminal connected to reference potential, the first and second supply terminals being connected to internal terminals of the operational amplifier to be acted upon by the supply and reference potentials, a first ohmic voltage divider connected between the signal output of the operational amplifier and reference potential, an ohmic resistor connected between the divider point of the first voltage divider and the inverting signal input of the operational amplifier for obtaining a real negative feedback, a second ohmic voltage divider connected between the first supply terminal and reference potential, a supply resistor connected between the divider point of the second voltage divider and the non-inverting signal input of the operational amplifier and a third supply terminal associated with the output stage of the operational amplifier, the third supply terminal being connected to reference potential and having no conducting connection to or being insulated from, the second supply terminal within the amplifier circuit the second supply terminal being exclusively connected from the input stage of the operational amplifier and the voltage dividers to reference potential.

8 Claims, 3 Drawing Figures

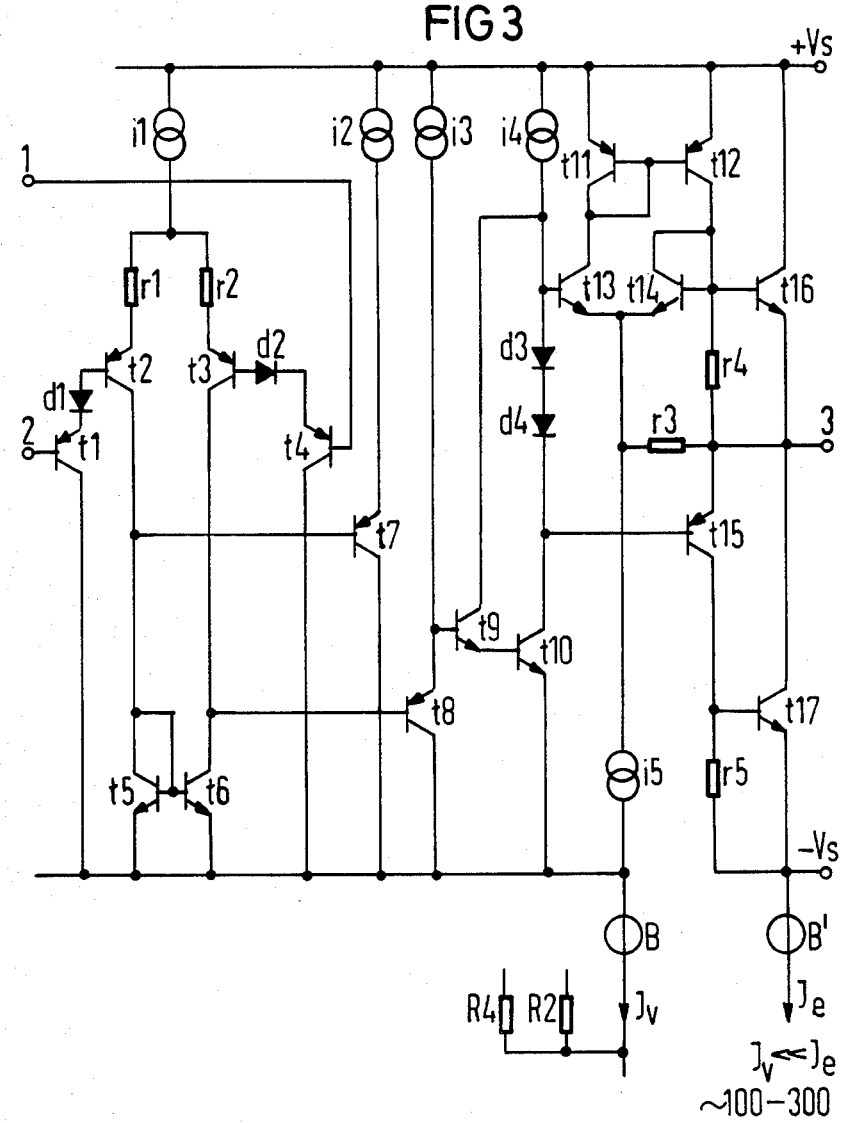

INTEGRATED AMPLIFIER CIRCUIT

The invention relates to an integrated amplifier circuit with an operational amplifier, a signal input terminal which is connected to the non-inverting input of the operational amplifier and can preferably be acted upon through an external capacitor, a signal output terminal connected to the signal output of the operational amplifier, a first supply terminal to be acted upon by a supply potential, as well as a second supply terminal which can be acted upon by the reference potential. Both supply terminals are connected by internal connecting lines to the internal terminals of the operational amplifier which can be acted upon by the supply potential or by the reference potential. The signal output of the operational amplifier is connected through a first ohmic voltage divider to the reference potential, and the divider tap of this voltage divider is connected, to the inverting signal input of the operational amplifier by means of an ohmic negative-feedback resistor, for the purpose of obtaining a real negative feedback. The non-inverting input of the operational amplifier is connected through a supply resistor to the divider point of a second ohmic voltage divider, one end terminal of which is connected to the supply terminal carrying the supply potential, while the other end terminal of the second voltage divider is acted upon by the reference potential.

Circuits of this type are known in the art, although not in integrated form. Furthermore, if the negative feedback divider of the circuit is integrated, a coupling must be provided, which is more fully described below with reference to the drawings. This coupling causes a disadvantageous increase in distortion of the amplifier circuit, which is especially problematical in output amplifiers for radio and television.

It is accordingly an object of the invention to provide an integrated amplifier circuit which overcomes the hereinaforementioned disadvantages of the heretofore-known devices of this general type, by correcting the interference or disturbance.

With the foregoing and other objects in view there is provided, in accordance with the invention, an integrated amplifier circuit, comprising a supply potential source, a reference potential source, an operational amplifier having an inverting signal input, a non-inverting signal input, a signal output, an input stage, an output stage, and internal terminals to be acted upon by the supply potential or the reference potential, a signal input terminal connected to the non-inverting signal input of the operational amplifier, a signal output terminal connected to the signal output of the operational amplifier, a first supply terminal connected to the supply potential source, a second supply terminal connected to the reference potential source, the first and second supply terminals being connected to the internal terminals of the operational amplifier, a first ohmic voltage divider having an end terminal connected to the signal output of the operational amplifier, another end terminal connected to the reference potential source, and a divider point, an ohmic resistor connected between the divider point of the first voltage divider and the inverting signal input of the operational amplifier for obtaining a real negative feedback, a second ohmic voltage divider having an end terminal connected to the first supply terminal, another end terminal connected to the reference potential source, and a divider point, a supply resistor connected between the divider point of the second voltage divider and the non-inverting signal input of the operational amplifier, and a third supply terminal associated with the output stage of the operational amplifier, the third supply terminal being connected to the reference potential source and having no conducting connection to or being insulated from, the second supply terminal within the amplifier circuit, the second supply terminal being exclusively connected from the input stage of the operational amplifier and the voltage dividers (connected to the signal inputs of the operational amplifiers) to the reference potential source.

In accordance with another feature of the invention there is provided a circuit including an external capacitor connected to the signal input terminal.

In accordance with a further feature of the invention there is provided a circuit including a first lead connected between the reference potential source and the second supply terminal, and a second lead separate from the first lead connected between the reference potential source and the third supply terminal.

In accordance with a concomitant feature of the invention the second lead is in the form of a cooling strap for the integrated amplifier circuit.

Other features which are considered as characteristic for the invention are set forth in the appended claims.

Although the invention is illustrated and described herein as embodied in an integrated amplifier circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 3 is a circuit diagram of an operational amplifier to be used in the circuit of FIG. 1 or 2.

Figure 1:
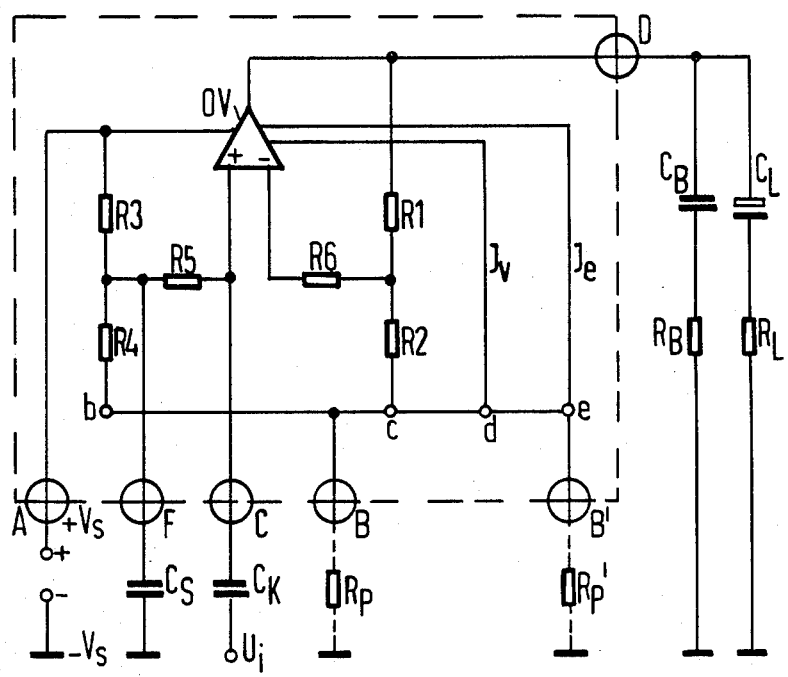
FIG. 1 is a schematic circuit diagram of an integrated amplifier circuit according to the invention with one operational amplifier.

Referring now to the Figures of the drawing in detail and first particularly to FIG. 1 thereof, there is seen an amplifier circuit which is conventional to a degree, but which also contains a feature which is essential for the invention. In all conventional circuits of this type, the signal output of an operational amplifier OV is connected, according to the description given above, to a signal output terminal D, while the non-inverting input provided as the signal input for the operational amplifier OV is connected directly to an input terminal C. In addition, the non-inverting input of the operational amplifier is connected through a supply resistor R5 to the divider point of a voltage divider formed of two series-connected resistors R3 and R4. The end of the voltage divider defined by the resistor R3 is connected to a terminal A for a supply potential $+V_s$ and the end defined by the resistor R4 is connected to a terminal B for a reference potential $-V_s$. A further voltage divider which is formed of two series-connected resistors R1 and R2, has one end defined by the resistor R1 connected to the signal output of the operational amplifier OV and another end defined by the resistor R2 connected to the terminal B for the reference potential $-V_s$.

In the conventional integrated amplifier circuits with an operational amplifier, the terminal B for the reference potential $-V_s$ is always fully responsible for acting on the two signal inputs of the operational amplifier as well as for supplying the reference potential of the operational amplifier itself.

It should furthermore be mentioned in connection with FIG. 1 that the divider point of the second voltage divider according to the description above, i.e. of the voltage divider R3, R4, is connected to a terminal F. The terminal F is connected to the reference potential $-V_s$ through a capacitor $C_s$, for the purpose of filtering. Furthermore, a coupling capacitor $C_k$ is provided at the signal input terminal C, through which a signal $U_i$ to be processed is passed to the circuit and is brought to the non-inverting signal input of the operational amplifier OV. The signal output terminal D is additionally provided for driving a load element $R_L$, which can be accomplished by means of a coupling capacitor $C_L$ or in other customary manners. The two series-connected circuit components $C_L$ and $R_L$ are shunted by a series circuit of a further capacitor $C_B$ and a resistor $R_B$. The components $R_B$ and $R_L$ are connected to the reference potential $-V_s$ and the components $C_B$ and $C_L$ are connected to the output terminal D of the amplifier circuit. The components $R_B$ and $C_B$ form a so-called Boucherot section.

The following observations are noted with respect to the integrated amplifier circuit constructed in accordance with the explanation given above: It is seen from FIG. 1 that in integrating the negative feedback divider R1, R2, the negative feedback base (R2) is coupled through the parasitic base resistance $R_p$ provided by the contact terminal or pin B, is coupled to the polarization divider R3, R4, and is coupled to the input stage current $J_v$ and to the output stage current $J_e$. This coupling, however, leads to a troublesome increase of the distortion of the amplifier circuit which has a disagreeable effect, particularly if such a circuit is used as the output amplifier for radio and television purposes.

It follows from this explanation that grounding points b, c, d and e shown in FIG. 1 can no longer be chosen freely, since they are within the integrated circuit and are fixed by the circuit. This means that a remedy for the above-mentioned disturbance is not possible without encountering difficulty if conventional means are used for this purpose. It can furthermore be stated that the parasitic resistance $R_p$ is caused substantially by the resistance of the contact pin or terminal and the lead to the pole of the d-c supply voltage source supplying the reference potential $V_s$. Since a remedy for the above-mentioned disturbance caused by the increase in the distortion has consequently not been available heretofore, monolithic integration of the amplifier circuit defined above was not possible.

According to the invention, a third supply terminal is provided in the amplifier circuit to correct the interference. The third terminal is acted upon by the reference potential which is associated with the output stage of the operational amplifier and has no internal conducting connection to the other supply terminal to be acted upon by the reference potential. This other supply terminal is only provided for supplying the reference potential $-V_s$ to the operational amplifier and to the two voltage dividers which are in conducting connection with the two signal inputs of the operational amplifier. This measure is also taken into consideration in the amplifier circuit according to FIG. 1 which thus corresponds to the present invention.

Figure 2:
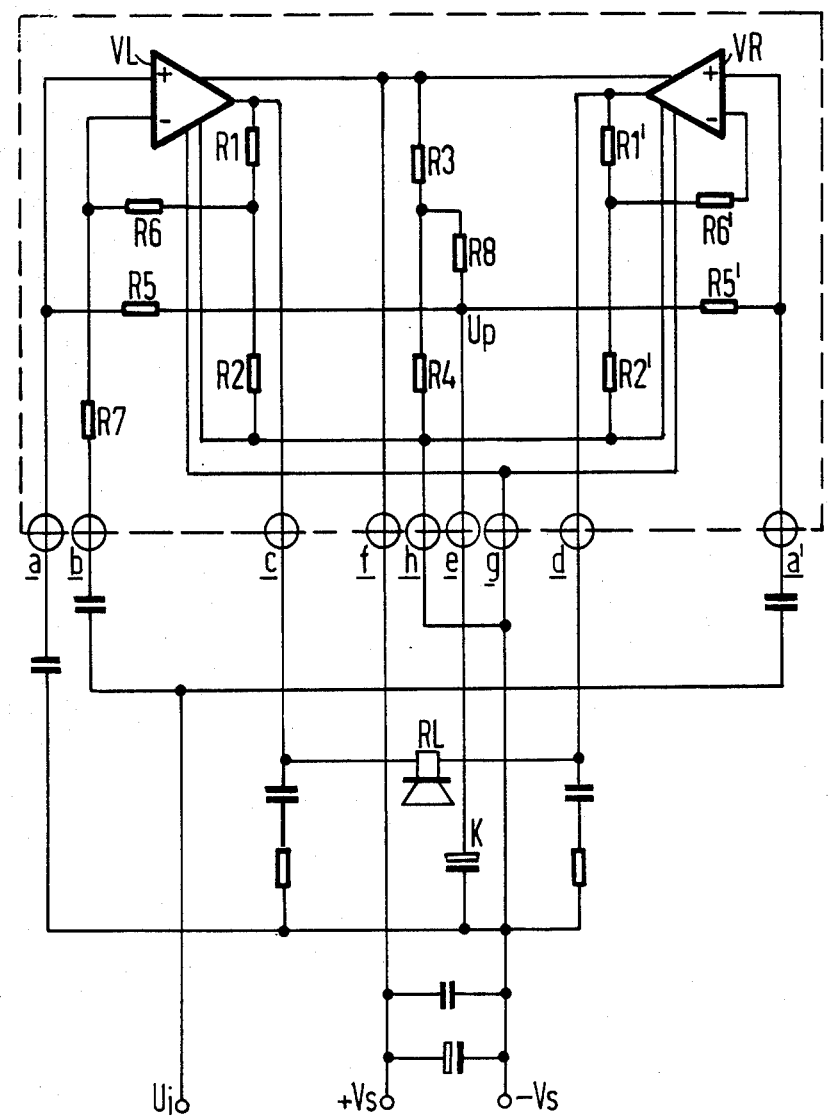
FIG. 2 is a circuit diagram of the amplifier circuit with two operational amplifiers.

It can be seen from FIG. 2 that the measures proposed according to the invention are also advantageous if two or more operational amplifiers are combined in the integrated semiconductor amplifier circuit. FIG. 3 additionally shows a practical embodiment for the operational amplifier or amplifiers to be used.

The current $J_e$ which is carried by the output stage of the operational amplifier OV exceeds all other currents flowing in the amplifier circuit by several orders of magnitude. It is therefore sufficient to eliminate the influence of this current on the negative feedback base point, i.e. on the negative feedback resistor R2 and on the resistor R4, i.e. in other words on the terminal B connected to these resistors. In order to reach this goal, it is basically possible to connect the supply current of the output stage of the operational amplifier OV carrying the output current $J_e$ to the common terminal B for the reference potential $-V_s$. However, this measure is not sufficient, as experience shows. For this reason, a terminal B' which is only provided for this purpose, is disposed on the semiconductor chip containing the amplifier circuit and only leads to the output stage of the operational amplifier OV, while no internal conducting connection of any kind is provided between the other supply terminal B which is acted upon by the reference potential $-V_s$ and the grounding terminal B' carrying the output current $J_e$.

In the structure according to the invention, two terminals of the semiconductor chip containing the amplifier circuit are therefore required, namely the two terminals B and B'. The purpose of the two terminals with respect to the internal circuit is already defined, and the terminals are completely insulated from each other internally. It is furthermore advisable for these two terminals B and B' to only come into conducting connection with each other through the pole terminal of the supply source supplying the reference potential $-V_s$, so that the external connections from the two terminals B and B' to the supply voltage source are also separate from each other.

It is further advisable for one terminal B' to be connected in a conducting manner to the cooling strap of the IC, and for the latter to only be provided for carrying off the output current $J_e$ of the operational amplifier to the supply voltage source.

As mentioned above, FIG. 2 shows an embodiment of the amplifier circuit according to the invention with two identical operational amplifiers VL and VR. The amplifiers serve as a bridge amplifier for operating a loudspeaker as the load $R_L$ through a suitable external connection. However, the amplifiers can also be operated as a stereo amplifier, as may be seen from co-pending U.S. application Ser. No. 532,722, Sept. 15, 1983 having the same inventor.

The embodiment of a semiconductor amplifier circuit according to the present invention as illustrated in FIG. 2, shows that each of the non-inverting signal inputs of the two operational amplifiers VL and VR is connected through a respective supply resistor R5, R5' to a common node carrying a polarization potential Up. This node carrying the potential Up, is connected on one hand through an intermediate resistor R8 to the divider point of the voltage divider R4, R3. As mentioned above, one end terminal of the voltage divider R4, R3 is supplied by the reference potential $-V_s$ and the other terminal is supplied by the supply potential $+V_s$. On the other hand, the node carrying the potential Up is connected through a capacitor K to the reference potential $-V_s$. It should be noted that the voltage divider R4, R3 and the circuit node are disposed inside the IC indicated by the broken line and the connection to the filter capacitor K is made through a terminal e. The other lead of the capacitor K is connected to the pole of the supply voltage source furnishing the reference potential $-V_s$.

The inverting input of the operational amplifier VL is connected through a resistor R7 to a signal input terminal b which is connected through a coupling capacitor without a reference symbol to the signal input for the signals Ui to be processed. In a manner commensurate with the connection of the amplifier VL, the non-inverting signal input of the other operational amplifier VR is connected through the corresponding signal input terminal a' of the semiconductor chip containing the amplifier circuit (the connection is likewise made through a capacitor which has no reference symbol), to the input of the overall circuit for the signal Ui to be processed by the amplifier. As to the difference between the two operational amplifiers VL and VR, it may merely be stated that in the case of the operational amplifier VL, the inverting signal input is connected through a resistor R7 to the signal input terminal b, while in the case of the operational amplifier VR, the non-inverting signal input is connected without a series resistor to the signal input terminal a'. In this connection, it should further be noted that the series resistor R7 is equal to the negative feedback resistor R6 which belongs to the operational amplifier VL. It is also noted that in another operating mode of the amplifier circuit, for instance if it is used as a stereo amplifier, the non-inverting signal input of the operational amplifier VL may also be addressed with a signal Ui to be processed. In this case, the signal Ui to be processed is likewise fed through a coupling capacitor without a reference symbol to the signal input terminal a leading to the non-inverting signal input of the amplifier VL. In this case, at least in most cases, the signal is not fed to the signal input terminal b and it is therefore not fed to the inverting signal input of the operational amplifier VL.

The negative feedback circuits R1, R2, R6 and R1', R2', R6', respectively, which likewise belong to the integrated portion of the circuit according to FIG. 2, are constructed and assembled in the same manner for both operational amplifiers VL and VR. In the case of the operational amplifier VL, the signal output is first connected through the resistor R1 and then through the negative-feedback resistor R6 to its associated inverting signal input. Therefore, the signal output in the case of the operational amplifier VR is connected through the resistor R1', corresponding to the resistor R1, and then to the negative-feedback resistor R6' and the resistor R6' is likewise connected to the inverting signal input of the amplifier VR. Furthermore, the terminal of the resistor R1' which is not connected to the output of the amplifier VR, is connected through the resistor R2' to the first terminal h for the reference potential $-V_s$. The same type of connection applies to the voltage divider resistor R1 which is connected to the output of the operational amplifier VL and is similarly connected through the resistor R2 to the terminal h for the reference potential. Finally, the base resistor R4 of the voltage divider R3, R4 mentioned above, serves for the voltage supply of the non-inverting signal input of the two operational amplifiers VL and VR. The non-inverting inputs are connected by means of the resistor R4, the intermediate resistor R8 and a respective one of the supply resistors R5 and R5', to the terminal h for the reference potential $-V_s$.

The terminal h is furthermore connected to the parts of the two operational amplifiers VL and VR which are to be addressed directly by the reference potential $-V_s$ and to the parts of the amplifiers which do not lead to the output stage current $J_e$ of the respective amplifier but only to the input stage current $J_v$ belonging to the respective amplifier VR or VL. According to the invention, a second supply terminal g for the reference potential $-V_s$ serves for supplying the output stage of the two amplifiers VL and VR. This supply terminal g is associated with both operational amplifiers VL and VR in common, and is only conductively connected to the other reference voltage h outside the integrated circuit proper.

With respect to the two signal output terminals c and d it should be noted that they are bridged or shunted by the loudspeaker RL to be driven by the amplifier. They are furthermore each connected through a respective series circuit formed of a capacitor and a resistor, to the pole of the supply voltage source furnishing the reference potential $-V_s$.

It is also noted that the pole of the supply voltage source furnishing the supply potential $+V_s$ is connected to the supply terminal f. On one hand, the terminal f is directly connected to an end terminal of the voltage divider R3, R4 responsible for supplying the voltage to the non-inverting signal input of the two operational amplifiers. This is the end of the divider R3, R4 which is not connected to the reference potential $-V_s$. In other words, the terminal f is connected to the free terminal of the resistor R3 in the interior of the integrated circuit. On the other hand, the terminal f for the supply potential $+V_s$ is connected to all of the points of the two operational amplifiers VL and VR which are to be directly addressed by the supply potential $+V_s$, regardless of whether they belong to the input stages or the output stages.

It is further recommended, in agreement with the disclosures of the above-mentioned U.S. application Ser. No. 532,722, that the negative-feedback resistor R6 of the operational amplifier VL be matched to the corresponding supply resistor R5 and the intermediate resistor R8 leading from the resistor R5 to the divider point of the voltage divider R3, R4. This matching is carried out in such a way that R6=R5+2R8 and R6'=R5'+2R8. For the case in which both operational amplifiers VL and VR are identical with respect to their construction, then R6 =R6'. As is explained in the above-mentioned patent application, a monolithic combination of the two operational amplifiers together with their negative feedback circuits in a common IC building block only becomes possible due to such a construction.

The circuitwise construction of the operational amplifiers OV or VL and VR advantageously depends on the circuit in the diagram shown in FIG. 3 which is constructed in complementary bipolar technology, and the monolithic manufacture of which presents no difficulties.

As shown in FIG. 3, the non-inverting input 1 of such an amplifier controls the base of a first pnp-transistor t4. The collector of the transistor t4 is connected to reference potential $-V_s$ and the emitter thereof is connected to the cathode of a diode d2 and through this diode d2 to the base of a second pnp-transistor t3. The circuitry of the inverting input 2 corresponds to the non-inverting input 1. The input 2 therefore forms the base terminal of a third pnp-transistor t1. The collector of the transistor t1 is likewise connected to reference potential $-V_s$ and the emitter thereof is connected to the cathode of a diode d1 and through this diode d1 to the base of a fourth pnp-transistor t2. The emitter of the second pnp-transistor t3 is connected through the series circuit of the two identical resistors r2, r1 to the emitter of the fourth pnp-transistor t2. In addition, the junction point between the two resistors r1 and r2 is connected through a constant-current source i1 to the terminal C or f for the supply potential $+V_s$ while the reference potential $-V_s$ for the first pnp-transistor t4 and the third pnp-transistor t1 is taken from the terminal B or h by the internal IC connections seen from FIGS. 1 or 2 and is supplied to the two transistors.

The collector of the second pnp-transistor t3 is connected to the collector of a first npn-transistor t6. The emitter of the transistor t6 is also supplied through the terminal B or h with the reference potential $-V_s$, and the base thereof is connected to the collector of the fourth pnp-transistor t2 as well as to the base and the collector of a second npn-transistor t5. The emitter of the second npn-transistor t5 is again connected to the supply terminal B or h, respectively, which is responsible for the supply of the above-mentioned transistors with the reference potential $-V_s$.

The collector of the second pnp-transistor t3 and the collector of the fourth pnp-transistor t2 each control the base of a respective further fifth and sixth pnp-transistor t8 and t7. The emitter of the pnp-transistor t7 controlled by the fourth pnp-transistor t2 is connected in this case through a current source i2 to the terminal A or f for the supply potential $+V_s$. The collector of the transistor t7 is connected to the terminal B or h for the reference potential $-V_s$. The emitter of the pnp-transistor t8 controlled by the second pnp-transistor t3 is connected through a further current source i3 to the supply potential $+V_s$, and the collector thereof is likewise connected to the terminal B or h for the supply potential $-V_s$ which has been exclusively mentioned in connection with FIG. 3 above. However, in contrast to the pnp-transistor t7, the emitter of the pnp-transistor t8 is connected to the base of a third npn-transistor t9, while an analogous connection is not provided for the transistor t7.

The emitter-collector path of the third npn-transistor t9 is shunted by a series circuit of two diodes d3, d4 poled in the same direction and the base-collector diode of a fourth npn-transistor t10. To this end, the collector of the third npn-transistor t9 is connected on one hand through a fourth constant-current source i4 to the terminal A or f for the supply potential $+V_s$. On the other hand, the collector of the transistor t9 is connected to the anode of the diode d3. The cathode of the diode d3 is connected to the anode of the diode d4, and the cathode of the diode d4 is connected to the collector of the fourth npn-transistor t10. The base of the fourth npn-transistor t10 is connected to the emitter of the third non-transistor t9. The emitter of the fourth npn-transistor t10 is connected through the terminal B or h to the reference potential $-V_s$, while the collector thereof is directly connected to the base of a seventh pnp-transistor t15, besides the already mentioned connections. It should also be mentioned that the collector of the third npn-transistor t9 is also connected to the base of a fifth npn-transistor T13.

The last-mentioned npn-transistor t13 forms an emitter-coupled differential amplifier together with a sixth npn-transistor t14. The two emitters of the transistors t13, t14 are also connected through a fifth current source i5 to the terminal B or h for the reference potential $-V_s$ which has been mentioned repeatedly in this connection and is at the same time responsible for the negative feedback R4, R2, etc. The collector of the fifth npn-transistor t13 is connected to the base and to the collector of an eighth pnp-transistor t11. The emitter of the transistor t11 is connected to the terminal A or f for the supply potential $+V_s$ and the base and collector thereof are furthermore connected to the base of a ninth pnp-transistor t12. The emitter of the pnp-transistor t12 is likewise directly driven by the terminal A or f for the supply potential $+V_s$ and the collector thereof is directly connected to the collector and the base of the sixth pnp-transistor t14.

Two further npn-transistors t16 and t17 are part of the output stage of the operational amplifier and are connected in series with respect to their emitter-collector paths. The collector of the seventh npn-transistor t16 is connected in this case to the terminal A or f for the supply potential $+V_s$ and its emitter is connected to a signal output 3 of the respective operational amplifier. On the other hand, according to the teachings of the present invention, the emitter of the eighth npn-transistor t17 is not connected to the terminal B or h mentioned so far, but instead to the terminal B' or g for the reference potential $-V_s$ which is specially provided for the output stage of the operational amplifier, so that the output current $J_e$ of the respective operational amplifier cannot come into contact with the base points of the voltage dividers R1, R2 and R3, R4 or R1', R2', respectively. The collector of the eighth npn-transistor t17 is connected directly to the signal output 3 of the operational amplifier. The base of the eighth npn-transistor t17 is connected by means of a resistor r5 to the reference potential $-V_s$, and specifically only through the terminal B' or g, respectively. The base of the npn-transistor t17 is furthermore connected to the collector of the seventh pnp-transistor t15 which is likewise part of the output stage.

On the other hand, the base of the seventh npn-transistor t16 is connected through a resistor r4 to the signal output 3 of the operational amplifier as well as to the emitter of the seventh pnp-transistor t15. Furthermore, the base of the seventh npn-transistor t16 is connected to the collector and to the base of the sixth npn-transistor t14. Additionally, the signal output 3 of the operational amplifier is connected through a resistor r3 to the emitter of the fifth and the sixth npn-transistors t13 and t14.

As seen in FIG. 3, the pnp-transistor t7 (the collector of which is connected to the terminal B or h for the reference potential $-V_s$) serves the purpose of compensating the base current of the pnp-transistor t8.

The above-described construction of the individual operational amplifier has the following substantial advantages:

(a) the diodes d1 and d2 ensure the common mode region of the input terminals 1 and 2 of the operational amplifier down to $V_s$; and (b) the offset can be minimized by the following measures:

(1) the base currents of the transistors t5 and t6 are compensated for the typical current gain by the emitter area ratio of the transistors t5 and t6; and (2) the base current of the transistor t8 is compensated as already indicated, by the base current of an identical pnp-transistor t7 which carries the same collector current as the transistor t8. Therefore, i2=i3 must apply.

The foregoing is a description corresponding in substance to German application No. P 32 35 289.1, dated Sept. 23, 1982, the International priority of which is being claimed for the instant application, and which is hereby made part of this application. Any material discrepancies between the foregoing specification and the aforementioned corresponding German application are to be resolved in favor of the latter.

I claim:

1. Integrated amplifier circuit, comprising a supply potential source, a reference potential source, an operational amplifier having an inverting signal input, a non-inverting signal input, a signal output, an input stage, and internal terminals to be acted upon by the supply potential and the reference potential, a signal input terminal connected to said non-inverting signal input of said operational amplifier, a signal output terminal connected to said signal output of said operational amplifier, a first supply terminal connected to said supply potential source, a second supply terminal connected to said reference potential source, said first and second supply terminals being connected to said internal terminals of said operational amplifier, a first ohmic voltage divider having an end terminal connected to said signal output of said operational amplifier, another end terminal connected to said reference potential source, and a divider point, an ohmic resistor connected between said divider point of said first voltage divider and said inverting signal input of said operational amplifier for obtaining a real negative feedback, a second ohmic voltage divider having an end terminal connected to said first supply terminal, another end terminal connected to said reference potential source, and a divider point, a supply resistor connected between said divider point of said second voltage divider and said non-inverting signal input of said operational amplifier, and a third supply terminal associated with said output stage of said operational amplifier, said third supply terminal being connected to said reference potential source and being insulated from said second supply terminal within the amplifier circuit.

2. Integrated amplifier circuit, comprising a supply potential source, a reference potential source, an operational amplifier having an inverting signal input, a non-inverting signal input, a signal output, an input stage, an output stage, and internal terminals to be acted upon by the supply potential and the reference potential, a signal input terminal connected to said non-inverting signal input of said operational amplifier, a signal output terminal connected to said signal output of said operational amplifier, a first supply terminal connected to said supply potential source, a second supply terminal connected to said reference potential source, said first and second supply terminals being connected to said internal terminals of said operational amplifier, a first ohmic voltage divider having an end terminal connected to said signal output of said operational amplifier, another end terminal connected to said reference potential source, and a divider point, an ohmic resistor connected between said divider point of said first voltage divider and said inverting signal input of said operational amplifier for obtaining a real negative feedback, a second ohmic voltage divider having an end terminal connected to said first supply terminal, another end terminal connected to said reference potential source, and a divider point, a supply resistor connected between said divider point of said second voltage divider and said non-inverting signal input of said operational amplifier, and a third supply terminal associated with said output stage of said operational amplifier, said third supply terminal being connected to said reference potential source and having no conducting connection to said second supply terminal within the amplifier circuit, said second supply terminal being exclusively connected from said input stage of said operational amplifier and said voltage dividers to said reference potential source.

3. Circuit according to claim 1, including an external capacitor connected to said signal input terminal.

4. Circuit according to claim 2, including an external capacitor connected to said signal input terminal.

5. Circuit according to claim 1, including a first lead connected between said reference potential source and said second supply terminal, and a second lead separate from said first lead connected between said reference potential source and said third supply terminal.

6. Circuit according to claim 2, including a first lead connected between said reference potential source and said second supply terminal, and a second lead separate from said first lead connected between said reference potential source and said third supply terminal.

7. Circuit according to claim 5, wherein said second lead is in the form of a cooling strap for the integrated amplifier circuit.

8. Circuit according to claim 6, wherein said second lead is in the form of a cooling strap for the integrated amplifier circuit.

* * * * *